(12) United States Patent
Chatterjee

(10) Patent No.: US 6,649,983 B2
(45) Date of Patent: Nov. 18, 2003

(54) VERTICAL BIPOLAR TRANSISTOR FORMED USING CMOS PROCESSES

(75) Inventor: Amitava Chatterjee, Plano, TX (US)

(73) Assignee: Texas Instruments Incorporated, Dallas, TX (US)

(*) Notice: Subject to any disclaimer, the term of this patent is extended or adjusted under 35 U.S.C. 154(b) by 0 days.

(21) Appl. No.: 09/998,262

(22) Filed: Nov. 30, 2001

(65) Prior Publication Data

US 2003/0102512 A1 Jun. 5, 2003

(51) Int. Cl.$^7$ ................................................ H01L 29/72
(52) U.S. Cl. ...................... 257/370; 257/371; 257/373; 257/375; 438/154; 438/199; 438/514
(58) Field of Search ................................. 257/370, 371, 257/373, 375; 438/154, 199, 514

(56) References Cited

U.S. PATENT DOCUMENTS 6,303,420 B1 * 10/2001 Sridhar et al. .............. 257/370

* cited by examiner

*Primary Examiner*—Edward Wojciechowicz
(74) *Attorney, Agent, or Firm*—Yingsheng Tung; Wade James Brady, III; Frederick J. Telecky, Jr.

(57) ABSTRACT

A vertical bipolar transistor is described which utilizes ion implantation steps which are used to form an nMOS field effect device and a pMOS field effect device. The implantation steps form an n-well, a p-well region, a pocket base region and an emitter region which are vertically oriented within a semiconductor substrate. The resulting bipolar device may have a significant relative gain and is constructed with no additional mask steps.

27 Claims, 2 Drawing Sheets

VERTICAL BIPOLAR TRANSISTOR FORMED USING CMOS PROCESSES

TECHNICAL FIELD OF THE INVENTION

This invention relates in general to the field of integrated electronic systems and more particularly to the architecture and formation of a vertical bipolar transistor constructed using adjunct CMOS processes.

BACKGROUND OF THE INVENTION

The construction of field effect devices in CMOS technologies involves the use of sequential implant processes to form conductive and semiconductive regions within the outer surface of a semiconductor substrate. These implant processes are optimized to enable the field effect devices to function in complimentary fashion. P-channel devices and n-channel devices are formed on the same substrate using photolithographic processes to cover certain of the devices while implant processes are performed on the remaining devices.

State of the art bipolar transistors require different implant and photolithographic masking processes. Many integrated architectures require or may be optimized if the integrated system can utilize both field effect and bipolar devices on the same integrated substrate. Unfortunately, the use of implant processes to form field effect devices and then subsequent different implant processes to form bipolar devices greatly increases the cost and complexity of the formation of the device. As such, designers have attempted to use the same implant processes for the field effect devices to create various bipolar structures within the integrated system. These techniques have been somewhat successful but have not utilized all of the potential implant regions possible with typical CMOS processing.

For example, U.S. Pat. No. 6,303,420 discloses a technique of using a pocket implant to form a base region of a bipolar transistor which utilizes the substrate as the collector. However, this technique is limited in its effectiveness because the formation of the emitter of the device must be extremely shallow to prevent eradication of the base region formed by the pocket implant. This shallow emitter dictates that the device must be masked from subsequent surface silicidation steps and that direct vertical contact to the emitter is not possible. In order to solve these problems, additional masking and horizontal contact coupling regions must be added which greatly increase the cost and complexity of the device.

SUMMARY OF THE INVENTION

Accordingly, a need has arisen for a new architecture and techniques for forming a bipolar transistor using the operations used to form CMOS devices in an integrated semiconductor system.

In accordance with the teachings of the present invention, integrated device architectures are provided herein that include vertical bipolar transistors formed using implant steps associated with the formation of adjunct CMOS devices. These techniques substantially reduce or eliminate problems associated with prior device architectures and formation techniques.

In accordance with one embodiment of the present invention, a pnp bipolar device is formed in parallel with an nMOS field effect device and a pMOS field effect device on a p-type semiconductor substrate. A p-type source drain implant is used to form the source and drain for the pMOS field effect device and an emitter of a vertical bipolar device. A n-type pocket implant is used to dope the channel of the pMOS field effect device and is also used to form the base region of the vertical bipolar device. A n-type implant process is used to form the source drain regions of nMOS field effect devices and is also used to form a base contact region for the base region of the vertical bipolar device. A p-type implant is used to form a p-type well region associated with nMOS field effect devices and is also used to form a collector coupling region of the vertical bipolar device. The p-type source drain implant is also used to form a collector contact region of the vertical bipolar device. A region of the p-type substrate forms the collector region of the pnp device. While bipolar pnp transistors which utilize the substrate as the collector can always be formed using adjunct CMOS processes by using the implanted n-well as the base region, by using an n-type pocket implant or an n-type high voltage drain extension implant to form the base region, the base region comprises a much lower Gummel number thereby increasing the $h_{fe}$ or current gain of the device.

An important technical advantage of the present invention inheres in the fact that implant processes which are used to form field effect devices on an integrated substrate can also be used to form vertical bipolar devices on the same substrate. In this manner, bipolar transistors can be used with both pMOS and nMOS field effect devices to create complex BiCMOS circuitry and bandgap reference circuits without incurring the complexity and costs associated with conventional techniques for forming these structures.

BRIEF DESCRIPTION OF THE DRAWINGS

A more complete understanding of the teachings of the present invention may be acquired by referring to the accompanying figures in which like reference numbers indicate like features and wherein.

DETAILED DESCRIPTION OF THE INVENTION

Figure 1:
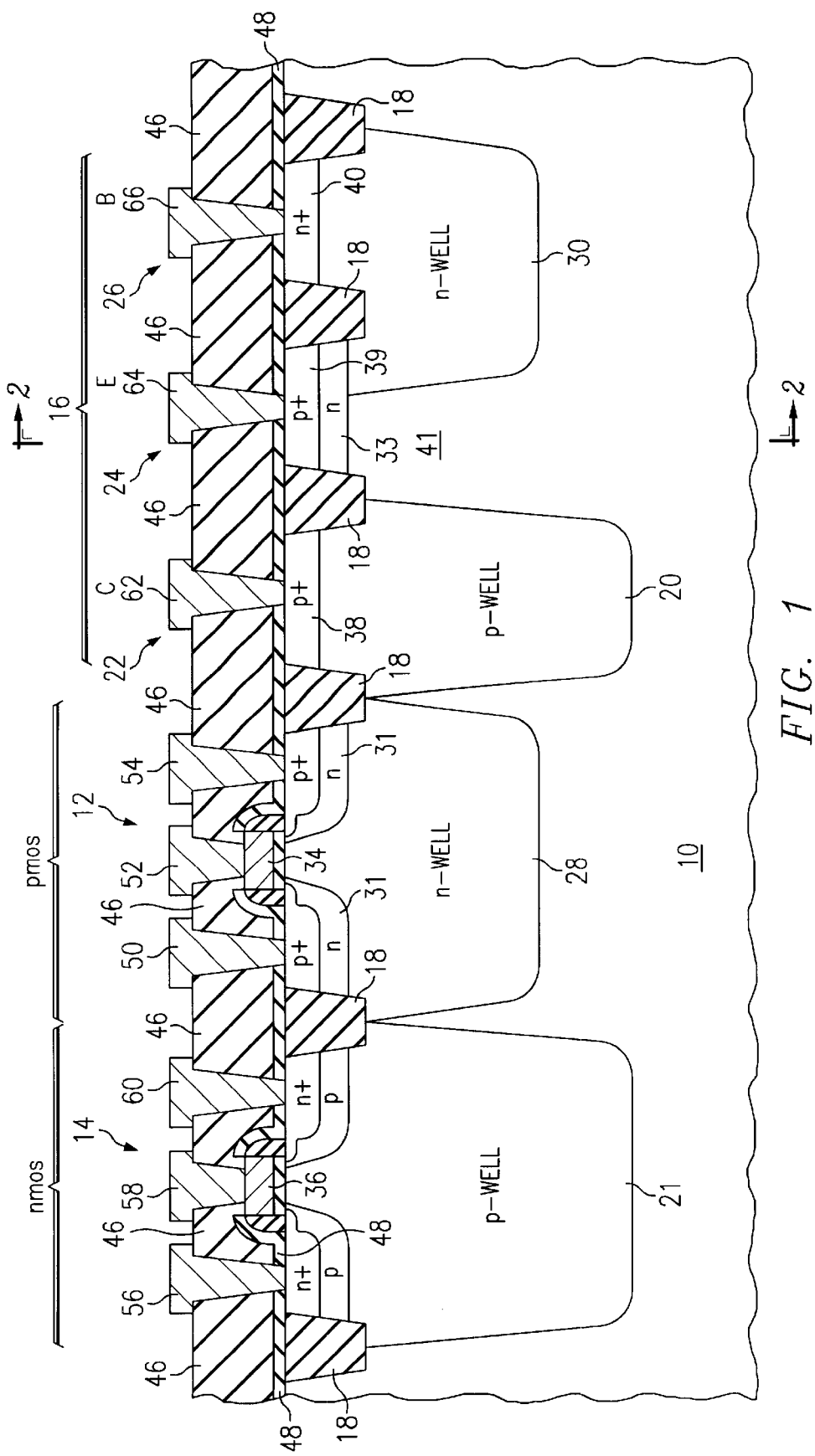
FIG. 1 is a greatly enlarged cross-sectional elevational schematic diagram of an integrated device architecture constructed according to one embodiment of the present invention.

FIG. 1 is an elevational diagram illustrating the completed structure of a number of transistors constructed on a semiconductor substrate 10. According to one embodiment of the present invention, the substrate 10 may comprise a background p-type doping such that the substrate exhibits resistivity on the order of between 2 to 10 Ohm-cm. FIG. 1 illustrates a completed pMOS field effect transistor indicated generally at 12, a completed nMOS field effect transistor indicated generally at 14 and a vertical pnp bipolar transistor indicated generally at 16.

The transistors 12, 14 and 16 are formed in the outer surface of substrate 10 by first isolating active regions from each other using trench isolation structures indicated at 18 in FIG. 1. Trench isolation structures 18 are formed by photolithographically patterning the outer surface substrate 10. Trenches are then formed in the outer surface of substrate 10. These trenches are then filled with a dielectric which may comprise, for example, silicon dioxide, silicon nitride, or combination thereof. Trench isolation structures 18 may be on the order of 0.35 microns in depth.

After the active regions within the outer surface of substrate 10 are defined through the formation of trench isolation structures 18, a number of ion implantation steps are performed to define doped regions within substrate 10. In general, an initial set of implant steps are performed on the pMOS and nMOS areas in sequence. These steps are followed by the formation of gate stack structures. Next, additional implant processes which are aligned to the edges of the gate stack structures are performed to complete the field effect devices. According to the teachings herein, these implant processes may be selectively used to form transistor 16 at the same time that transistors 12 and 14 are being formed. Different ion implementation steps are typically used for the nMOS regions as compared to the pMOS regions. In the initial implant steps, a nMOS device such as transistor 14 will typically receive a number of successive implants of p-type boron ions at various energies. Alternatively, a pMOS device such as transistor 12 will typically receive a number of successive implantation steps of either arsenic or phosphorous ions. Although any variety of implantation steps may be performed without departing from the spirit of the present invention, an exemplary set of implantation steps will be presented here for purposes of teaching and managing of the present invention. Accordingly, the embodiment in the disclosed FIG. 1 both transistors 12 and 14 are subjected to initial implant steps comprising a threshold voltage implant, a punch-through implant, a channel stop implant, and a well implant. These implantation steps are performed using boron ions for the nMOS region with the pMOS regions being covered by photolithographically defined mask layers. In comparison, the pMOS regions are exposed to the same implant steps using phosphorus or arsenic ions while the NMOS regions are covered with photolithographically defined mask layers. As will be described herein, some of the active regions may be subjected to neither the n-type nor p-type ion implantation steps. According to the teachings of the present invention, this provides for a dopant profile within the substrate 10 which can be used to form a vertical bipolar transistor. In this manner, the ion implantation steps which are used to form and optimize adjunct field effect devices can be utilized to form bipolar structures without altering the character or energy levels of the field effect ion implantation steps and without the expense associated with additional masking steps. As discussed previously, the substrate 10 is doped initially to be p-type with a resistivity on the order of 2–10 Ohm-cm. As will be detailed herein, this allows unaltered portions of the substrate to form the collector region of the bipolar device.

According to one embodiment of the present invention, the nMOS implantation steps comprise a threshold voltage implant step which utilizes boron ions at an energy of 10 keV and an ion dose of approximately 5E12 ions/cm$^2$. This is followed by a punch through implantation step of boron ions at an energy of approximately 35 keV and an ion dose of approximately 1E12 ions/cm$^2$. Subsequently a channel stop implant step is performed comprising boron ions at an energy of approximately 120 keV and an ion dose of approximately 8E12 ions/cm$^2$. Finally, the p-well implant step is performed which comprises boron ions at an energy of approximately 300 keV and an ion dose of approximately 5E13 ions/cm$^2$. Referring to FIG. 1, the p-well implant step results in the formation of p-wells 20 and 21 shown in FIG. 1. As shown in FIG. 1, the active region associated with transistor 14 is subjected to these p-type ion bombardments. Further, an active region indicated generally at 22 which will form a collector coupling portion of transistor 16 is also subjected to these p-type ion bombardments. FIG. 1 also illustrates an active region 26 which will form the n-type base region of transistor 16 and, as such, is only subjected to the n-type ion bombardment. The active region associated with transistor 12 is subjected only to the n-type ion bombardment at this stage. The treatment of active region 24 is more complex because both the emitter and portions of the base regions of the vertical bipolar transistor are formed in active region 24. The emitter region 39 is formed with a later p-type source drain implant. A portion of the base of transistor 16 disposed in region 24 is formed using a later pocket implant step. Region 24 is masked from the p-well implant step, the p-type punch through, the p-type channel stop and the p-type threshold voltage implant step to insure that the n-type pocket implant will create a sufficiently n-type base region. Active region 24 is shielded from the p-well implantation process to prevent the p-type ions from eradicating the n-type ions implanted during the pocket implant. A portion of active region 24 is subjected to n-type ion implantation in order to form the profile of n-well region 30 shown in FIG. 1 while the remainder of active region 24 is masked from this bombardment so that it retains the p-type character of the substrate.

The ion implantation steps described to this point are used to form internal doped regions within the substrate 10. Subsequent ion implantation steps after the formation of outer gate stack structures will be used to form contact regions. As will be discussed herein, the contact regions are highly doped regions of the outer surface of substrate 10. For field effect devices, the contact regions are constructed to act as the source and drain regions of the device and typically comprise highly doped n-type regions for a nMOS structure and a highly doped p-type regions for a pMOS structure.

According to one embodiment of the present invention, the n-type ion implantation steps used to construct a base region 33 and base coupling region 30 of the pnp bipolar device and the internal regions of the pMOS field effect device begin with a threshold voltage implant of phosphorous or arsenic ions at an energy of approximately 30 keV and an ion dose of approximately 3E12 ions/cm$^2$. This is followed by a punch through implant of phosphorous or arsenic ions at an energy of approximately 100 keV and an ion dose of approximately 1E12 ions/cm$^2$. Next, a channel stop implant is performed using phosphorous or arsenic ions of approximately 360 keV and an ion dose of approximately 4E12 ions/cm$^2$. Finally, an n-well implant comprising phosphorous or arsenic ions is performed at an energy of approximately 500 keV and an ion dose of approximately $5E^{13}$ ions/cm$^2$. Referring to FIG. 1, the n-well implants step results in the formation of an n-well region 28 associated with transistor 12. In addition, the n-well base coupling region 30 is formed in active region 26 and under a portion of active region 24 as shown in FIG. 1. The actual dopant profile of the regions discussed herein will be discussed in more detail with reference to FIG. 2.

Following the completion of the implantation steps described previously, a post implant anneal step can be used to activate the dopants and to smooth the dopant profiles within the regions and to heal any implantation damage that occurred during the processing. This post implant anneal may comprise, for example, a suitable rapid thermal anneal process.

Following the anneal step a series of processes are used to form the gate stacks for the field effect devices 12 and 14. These processes result in the formation of a pMOS gate stack 34 and a nMOS gate stack 36 shown in FIG. 1. A number of suitable techniques may be used to form suitable gate stacks for the field effect devices 12 and 14. However, these processes will typically involve the formation of a suitable gate oxide layer followed by the formation of the gate conductor body typically comprising doped poly-silicon material. The poly-silicon gate conductor and gate oxide are then patterned and etched to form the central portion of the gate stacks 34 and 36. A self-aligned drain extension implant process is then used to partially form the source and drain region of the field effect devices 12 and 14. For pMOS device 12 the drain extension implant will comprise an implantation of boron ions. In comparison, the drain extension implant for nMOS device 14 will comprise an implantation of arsenic or phosphorous ions. Following the drain extension implants sidewall insulators bodies are formed on opposing walls of the central gate structures and the final source and drain implants are performed. In MOSFET devices, the threshold voltage of the device is highly sensitive to the length of the device channel. This sensitivity can be addressed by a self-aligned pocket implant process of n-type impurities for a pMOS device and p-type impurities for a nMOS device. The n-type pocket implant may comprise the implantation of phosphorous ions at an energy of 40 keV and a dose of between 6E13 and 9.2E13 ions/cm$^2$. This implant may also be angled to the surface of the substrate 10 at an angle of about 15 degrees in order to implant ions inwardly from gate stack 34. This implant results in the formation of pocket regions 31 in device 12 and base region 33 in active region 24. The remaining regions of the substrate are masked from this implant. By masking active region 24 from deep p-type implants, the pocket implant will be sufficiently deep to insure that the base region 33 exists after the formation of shallower p-type emitter region 39 in a subsequent step.

In certain integrated device architectures, field effect devices having different operating characteristics may be formed on the same substrate. For example, integrated devices can be designed to work with two different power supply voltage levels, a low voltage level for logic devices and a higher voltage level for input/output devices. For example, certain devices might use both 1.5V and 3.3V power supplies. In these architectures, the CMOS processes used to form the high voltage devices may include a higher dose or energy implant to form the source and drain regions of the higher voltage transistors. For example, an implant process may be used that implants phosphorous ions at an energy of 45 keV and a dose of 5.0E13 ions/cm$^2$ and arsenic ions at an energy of 80 keV and a dose of 1.0E14 ions/cm$^2$. If these higher voltage devices are to be formed on the same substrate, the availability of these high voltage source drain implant processes may be used to further enhance the dopant profile of base region 33 to further insure that base region 33 will survive the later formation of emitter region 39. The implant processes used to form base region 33 can result in n-type ions in sufficient density to be projected into the surface of substrate 10 to a depth on the order of 480–540 nanometers. This depth is sufficient to insure that region 33 is not masked by the later formation of p-type emitter region 39. It should be understood that various device designs may utilize, in the formation of region 33, only the pocket implant, only the high voltage source drain implant or both the pocket implant and the high voltage source drain implant as the circumstances warrant.

As before, p-type boron ions are implanted to form the source and drain regions of device 12 and n-type arsenic or phosphorous ions are implanted to form the source and drain regions of device 14. The drain extension implants and source drain implants steps may comprise any suitable energy level and dosage to achieve a suitably conductive region for the operation of the field effect devices 12 and 14. For example, the p-type source drain implant may comprise an implantation of boron ions at an energy of 5 keV and a dose of 1E15 ions/cm$^2$ and the n-type implants may comprise the implantation of arsenic at an energy of 10 keV and a dose of 1E15 ions/cm$^2$.

Referring again to the bipolar device formed in active regions 22, 24 and 26, the drain extension implant and source drain implants are used to form contact regions or active regions within the bipolar device. For example, the implantation of the boron ions used to form the source and drain of device 12 is also used to form a p-type collector contact region 38 shown in FIG. 1. Contact region 38 acts as a contact point for electrical connection to p-well region 20. This p-type implant is also used to form the emitter region 39 in active region 24. In comparison, the implantation of phosphorous or arsenic ions that were used to form the source and drain regions of device 14 are used to form a base contact region 40 disposed on the outer surface of substrate 10 in contact with base coupling region 30 within active region 26. The regions formed in active regions 22, 24 and 26 together form a vertical pnp bipolar transistor indicated generally at 16 which comprises a base contact region 40, an emitter region 39, and a collector contact region 38 formed in regions 26, 24 and 22, respectively. Contact region 38 serves to electrically connect to a collector coupling region 20. A portion of the substrate indicated generally at 41 acts as the collector of bipolar transistor 16. Finally, base contact region 40 acts as an electrical connection to base coupling region 30 which electrically couples the base region 33 to the base contact region 40.

The integrated structure shown in FIG. 1 is completed by first forming an inter-level dielectric layer 46. Layer 46 may comprise a layer of silicon dioxide or a combination of a layer of silicon dioxide and an etch stop layer 48 shown in FIG. 1 which may comprise, for example, silicon nitride. The dielectric layers 46 and 48 may be patterned and etched using suitable photolithographic processes to form contact openings. These openings may then be filled with suitable conductive material such as tungsten to form a source contact 50, a gate contact 52 and a drain contact 54 associated with field effect device 12. In addition, the same conductive material may be used to form a source contact 56, a gate contact 58 and a drain contact 60 of field effect device 14. Finally, the conductive material may also be used to form a collector contact 62 and emitter contact 64 and a base contact 66 associated with bipolar device 16.

Figure 2:
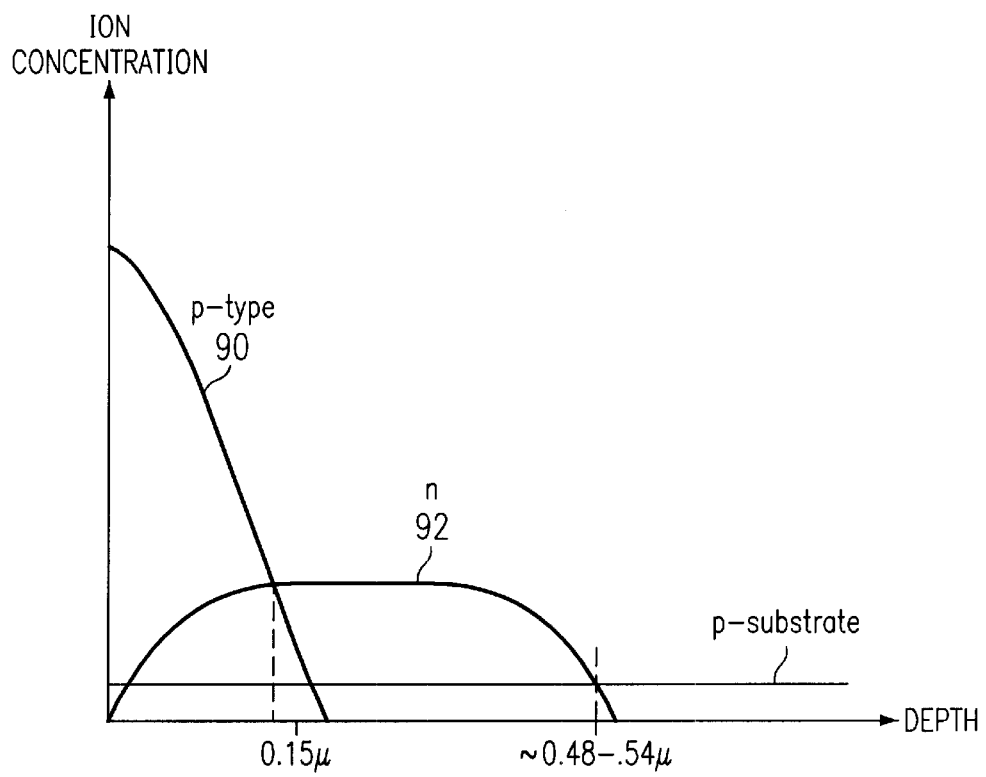
FIG. 2 is a graphical illustration of a dopant concentration profile associated with the device architecture of FIG. 1.

FIG. 2 is a graphical illustration of the approximate dopant profiles of the structure shown in FIG. 1 taken along a line 2—2 shown in FIG. 1. Referring to FIG. 2, the emitter contact region is shown as a highly concentrated p-type region 90 shown in FIG. 2. The pocket n-type base region 33 is shown as a lower concentrated n-type region 92 in FIG. 2. The base collector junction is approximately 0.48–0.54 microns from the outer surface of substrate 10 shown in FIG. 1. The junctions of regions 90 and 92 will typically be on the order of 0.15 microns from the surface of the substrate. The p-type substrate 10 forms the collector of the device as shown in FIG. 2.

One advantage of the embodiment shown in FIG. 1 is that the base region of the device which correspond to region 92 shown in FIG. 2 are associated with a relatively low Gummel number. The Gummel number is related to the number of carriers within the base region. In general, the Gummel number is inversely proportional to the possible gain which may be realized from the operation of the bipolar device. As such, the use of a relatively low dopant concentration within the base region of the resulting bipolar devices results in a potentially high gain available for the operation of the devices.

An additional advantage of the techniques shown is that the bipolar device is formed with a relatively small base region with a correspondingly low Gummel number without the added cost or complexity of structures or techniques needed to guard the base region from later emitter formation or complex contact techniques. The use of the pocket implant or high voltage drain extension implant to create or enhance the base region and the careful shielding of this region from p-type boron implants that comprise the p-well of the nMOS implants allows for the formation of a pnp bipolar device using only adjunct CMOS processes.

It should be understood that the dopant energies and concentrations described herein are solely for the purposes of teaching several specific embodiments of the present invention and a myriad of other dopant profiles concentrations and dosages maybe similarly implemented according to the teachings of the present invention. Similarly, the examples presented herein result in the formation of an pnp bipolar device. The same technique could easily be adapted to the formation of a NPN device or other more complex structures.

Accordingly, although the present invention has been described in detail, it should be understood that any number of alterations, substitutions, or modifications may be made to the teachings described herein without departing from the spirit and scope of the present invention which is solely defined by the appended claims.

What is claimed is:

1. A method for forming a plurality of transistors proximate an outer surface of a semiconductor substrate comprising:
    providing a semiconductor substrate doped with ions of a first conductivity;
    forming a base coupling region of a bipolar transistor and a well region of a first field effect transistor by implanting ions having a second conductivity type in a first common ion implantation step;
    forming a base region of the bipolar transistor and doping a region of a field effect transistor by implanting ions having the second conductivity type using a second common ion implantation step;
    forming a collector coupling region of the bipolar transistor and a well region of a second field effect transistor by implanting ions having a first conductivity type using a third common ion implantation step;
    forming an emitter region of the bipolar device and source and drain regions of the first field effect device by implanting ions of the first conductivity type into the outer surface of the substrate using a fourth common ion implant step; and
    providing a portion of the substrate proximate the collector coupling region that is free of ions of the common ion implantation steps to form the collector of the bipolar device.

2. The method of claim 1 wherein the fourth common implant step is also used to form a collector contact region proximate the outer surface of the substrate and electrically coupled to the collector coupling region and the collector region of the bipolar transistor.

3. The method of claim 1 wherein the second common ion implantation step comprises a pocket implant step and wherein the pocket implant step dopes the channel region of the first field effect transistor.

4. The method of claim 1 wherein the second common ion implantation step comprises a high voltage drain extension implant step that forms a portion of the drain region of a high voltage field effect transistor.

5. The method of claim 1 and further comprising the step of forming source and drain regions of the second field effect device and forming a base contact region by implanting ions of the first conductivity type into a region of the outer surface of the substrate using a fifth common ion implant step.

6. The method of claim 1 wherein the ions of the first conductivity type comprise p-type ions and the ions of the second conductivity type comprise n-type ions.

7. The method of claim 6 wherein the p-type ions comprise boron ions.

8. The method of claim 6 wherein the n-type ions comprise ions chosen from a class consisting of phosphorous and arsenic.

9. The method of claim 1 and further comprising the step of forming an insulator body proximate the outer surface of the substrate and disposed between the collector contact region and the emitter region.

10. The method of claim 1 and further comprising the step of forming an insulator body proximate the outer surface of the substrate and disposed between the emitter region and a base contact region.

11. An integrated electronic device comprising a plurality of active electronic devices formed in a semiconductor substrate doped with ions of a first conductivity type, comprising:
    a first field effect device comprising a gate stack structure disposed proximate the outer surface of the semiconductor substrate, the first field effect device comprising source and drain regions comprising ions of the first conductivity type, the source and drain regions disposed proximate opposing edges of the gate stack structure, the first field effect device disposed in a well region comprising ions of a second conductivity type,
    a second field effect device comprising source and drain regions comprising ions of the second conductivity type, the second field effect device comprising a second gate stack structure disposed on the outer surface of the semiconductor layer and between the source and drain regions of the second field effect device, the second field effect device disposed in a well region comprising ions of the first conductivity type;
    a bipolar device comprising a base region comprising ions of the second conductivity type formed using a second common ion implant process that also forms a region of a field effect device, a base coupling region formed using a first common implant process that also forms the well region of the first field effect device, a collector coupling region comprising ions of the first conductivity type, an emitter region comprising ions of the first conductivity type formed using a third common ion implant process that also forms the source and drain region of the first field effect device; and
    a portion of the substrate proximate the collector coupling region, being doped with ions of the first conductivity type and free of ions from the common implant steps, forming a collector region of the bipolar device.

12. The device of claim 11 wherein the third common implant step is also used to form a collector contact region proximate the outer surface of the substrate and electrically coupled to the collector region.

13. The device of claim 11 wherein the ions of the first conductivity type comprise p-type ions and the ions of the second conductivity type comprise n-type ions.

14. The device of claim 11 wherein the source and drain regions of the second field effect device and a base contact region are formed by implanting ions of the second conductivity type into a region of the outer surface of the substrate using a fourth common ion implant step.

15. The device of claim 13 wherein the p-type ions comprise boron ions.

16. The device of claim 13 wherein the n-type ions comprise ions chosen from a class consisting of phosphorous and arsenic.

17. The device of claim 11 and further comprising an insulator body proximate the outer surface of the substrate and disposed between the collector region and the emitter region.

18. The device of claim 11 and further comprising an insulator body proximate the outer surface of the substrate and disposed between the emitter region and a base contact region electrically connected to the base region.

19. A method for forming a plurality of transistors proximate an outer surface of a semiconductor substrate comprising:

forming a base coupling region of a bipolar transistor and a well region of a first field effect transistor by implanting ions having a first conductivity type in a first common ion implantation step;

forming a base region of the bipolar device and a region of a field effect device using a second common ion implantation step;

forming a collector coupling region of the bipolar transistor and doping the channel region of a second field effect transistor by implanting ions having a second conductivity type using a third common ion implantation step, the substrate being doped with ions of the second conductivity type such that a portion of the substrate proximate the collector coupling region forms the collector of the bipolar device;

forming an emitter region of the bipolar device and source and drain regions of the first field effect device by implanting ions of the second conductivity type into the outer surface of the substrate using a fourth common ion implant step;

forming a collector contact region proximate the outer surface of the substrate and electrically coupled to the collector coupling region using the fourth common implant step; and forming source and drain regions of the second field effect device and forming a base contact region by implanting ions of the first conductivity type into region of the outer surface of the substrate using a fifth common ion implant step.

20. The method of claim 19 and further comprising the step of forming source and drain regions of the second field effect device and forming a base contact region by implanting ions of the first conductivity type into a region of the outer surface of the substrate using a fifth common ion implant step.

21. The method of claim 19 wherein the ions of the first conductivity type comprise n-type ions and the ions of the second conductivity type comprise p-type ions.

22. The method of claim 19 wherein the ions of the first conductivity type comprise n-type ions and the ions of the second conductivity type comprise p-type ions.

23. The method of claim 22 wherein the p-type ions comprise boron ions.

24. The method of claim 22 wherein the n-type ions comprise ions chosen from a class consisting of phosphorous and arsenic.

25. The method of claim 1 in which the second common ion implantation step includes a pocket implant step for a field effect transistor and a ion implant step for a high voltage device.

26. The integrated electronic device of claim 11 in which the base region of the bipolar transistor includes the implanted ions of a pocket implant region and implanted ions of a ion implant step for a high voltage device.

27. The method of claim 19 in which the second common ion implantation step includes a pocket implant step for field effect transistor and ion implant step for a high voltage diode.

* * * * *